United States Patent
Luan et al.

(10) Patent No.: US 7,670,638 B2
(45) Date of Patent: Mar. 2, 2010

(54) PROTECTION LAYER FOR FABRICATING A SOLAR CELL

(75) Inventors: Hsin-Chiao Luan, Palo Alto, CA (US); Peter Cousins, Menlo Park, CA (US)

(73) Assignee: Sunpower Corporation, San Jose, CA (US)

( * ) Notice: Subject to any disclaimer, the term of this patent is extended or adjusted under 35 U.S.C. 154(b) by 1 day.

(21) Appl. No.: 12/106,561

(22) Filed: Apr. 21, 2008

(65) Prior Publication Data

US 2008/0283490 A1 Nov. 20, 2008

Related U.S. Application Data

(60) Provisional application No. 60/930,800, filed on May 17, 2007.

(51) Int. Cl.
*C23C 16/24* (2006.01)
*H01B 13/00* (2006.01)

(52) U.S. Cl. .......................... 427/58; 427/74; 427/569; 427/585; 216/13

(58) Field of Classification Search .................. 427/569; 216/13
See application file for complete search history.

(56) References Cited

U.S. PATENT DOCUMENTS

| | | | |
|---|---|---|---|
| 4,927,770 A | 5/1990 | Swanson | |
| 4,945,065 A | 7/1990 | Gregory | |
| 5,053,083 A | 10/1991 | Sinton | |
| 5,360,491 A * | 11/1994 | Carey et al. | 136/256 |
| 7,339,110 B1 | 3/2008 | Mulligan | |
| 2004/0200520 A1* | 10/2004 | Mulligan et al. | 136/256 |
| 2004/0259335 A1* | 12/2004 | Narayanan et al. | 438/584 |
| 2005/0098105 A1* | 5/2005 | Fuss et al. | 118/715 |
| 2006/0172518 A1* | 8/2006 | Frohberg et al. | 438/586 |
| 2006/0196535 A1* | 9/2006 | Swanson et al. | 136/244 |

FOREIGN PATENT DOCUMENTS

| | | |
|---|---|---|
| JP | 2001-036102 A | 2/2001 |
| JP | 2004-039751 A | 2/2004 |

OTHER PUBLICATIONS

International Search Report and Written Opinion of the International Searching Authority, PCT/US2008/006165 filed May 13, 2008, mailed Dec. 5, 2008.

* cited by examiner

*Primary Examiner*—Shamim Ahmed
(74) *Attorney, Agent, or Firm*—Blakely, Sokoloff, Taylor & Zafman LLP

(57) ABSTRACT

A method for fabricating a solar cell is described. The method includes first providing, in a process chamber, a substrate having a light-receiving surface. An anti-reflective coating (ARC) layer is then formed, in the process chamber, above the light-receiving surface of the substrate. Finally, without removing the substrate from the process chamber, a protection layer is formed above the ARC layer.

20 Claims, 4 Drawing Sheets

PROTECTION LAYER FOR FABRICATING A SOLAR CELL

CROSS REFERENCE TO RELATED APPLICATIONS

This application claims the benefit of U.S. Provisional Application No. 60/930,800, filed May 17, 2007, the entire contents of which are hereby incorporated by reference herein.

TECHNICAL FIELD

Embodiments of the present invention are in the field of Semiconductor Fabrication and, in particular, Solar Cell Fabrication.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto.

Typically, the surface of the solar cell to receive radiation is textured and/or coated with a layer or coating of an anti-reflective material to decrease the reflection of light, thereby increasing the efficiency of the solar cell. The fabrication of such solar cells, in particular the formation of the p-n junction and contacts thereto, involves a number of complicated process steps including the deposition, doping and etching of many different layers of material. These process steps are performed or carried out with low variation tolerances using many different processing tools under controlled environmental conditions.

Accordingly, there is a need for a simplified process for fabricating solar cells that reduces the number of separate steps needed, thereby reducing the time and cost of fabricating solar cells. It is further desirable that the method eliminates entirely the need for one or more processing tools, thereby further reducing the cost of fabricating solar cells.

DETAILED DESCRIPTION

Methods to fabricate a solar cell are described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps, are not described in detail in order to not unnecessarily obscure the present invention. Furthermore, it is to be understood that the various embodiments shown in the Figures are illustrative representations and are not necessarily drawn to scale.

Disclosed herein is a method to fabricate a solar cell. A substrate having a light-receiving surface may be provided in a process chamber. In an embodiment, an anti-reflective coating (ARC) layer is then formed, in the process chamber, above the light-receiving surface of the substrate. Finally, without removing the substrate from the process chamber, a protection layer (also known as an etch mask) may then be formed above the ARC layer. In one embodiment, the protection layer comprises amorphous carbon. In another embodiment, the protection layer comprises amorphous silicon.

Formation of a protection layer on an ARC layer may enable preservation of the ARC layer during various process operations in the fabrication of a solar cell. For example, in accordance with an embodiment of the present invention, a protection layer is used to maintain the integrity of an ARC layer disposed on a solar cell substrate during exposure of the solar cell substrate to a buffered oxide etch (BOE). In order to reduce the number of processing steps required to fabricate a completed solar cell, the protection layer may be fabricated in the same process tool as the ARC layer. For example, in accordance with an embodiment of the present invention, an ARC layer is first formed on a solar cell substrate in a process chamber. Then, without removing the substrate from the process chamber, the protection layer is formed on the ARC layer.

Figure 1:
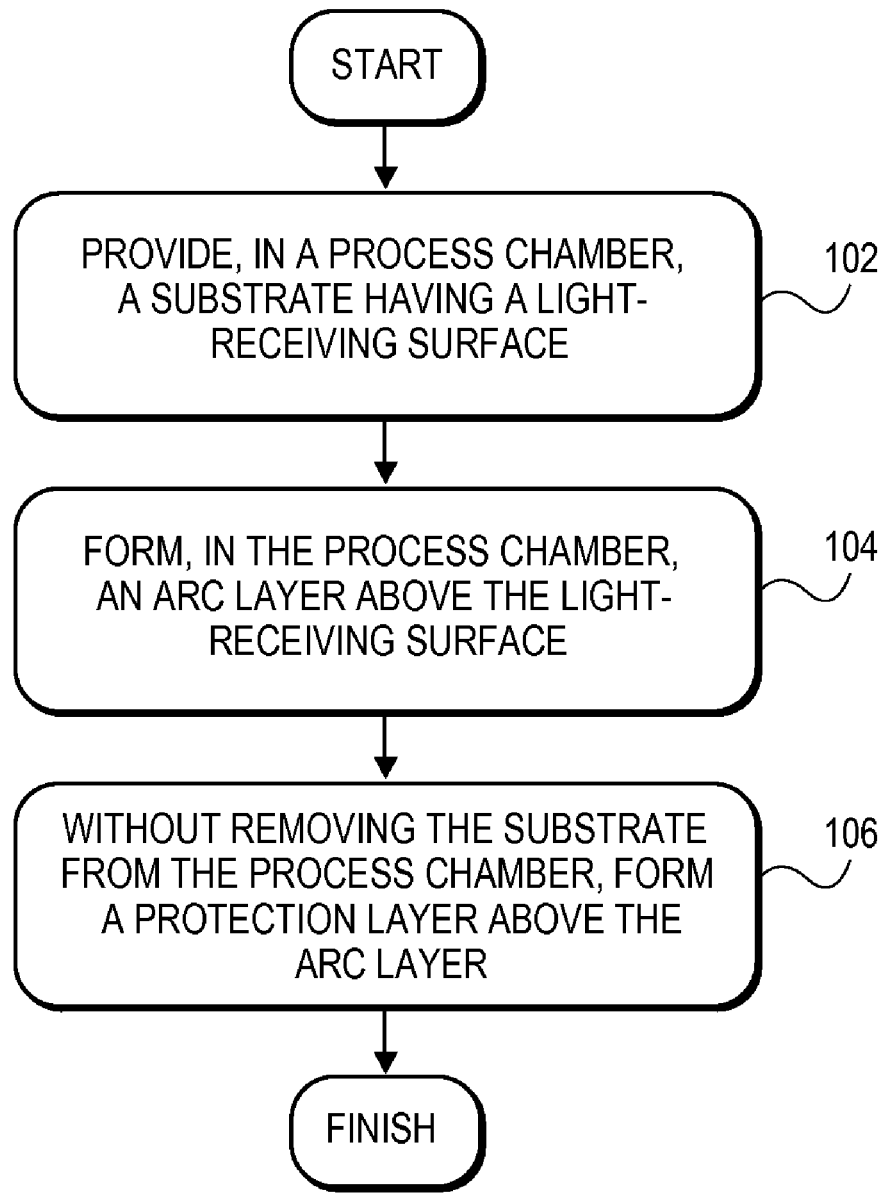
FIG. 1 depicts a Flowchart representing a series of operations in a method for fabricating a solar cell, in accordance with an embodiment of the present invention.

A protection layer may be utilized in the fabrication of a solar cell. FIG. 1 depicts a Flowchart 100 representing a series of operations in a method for fabricating a solar cell, in accordance with an embodiment of the present invention. FIGS. 2A-2G illustrate cross-sectional views representing operations in the fabrication of a solar cell, in accordance with an embodiment of the present invention.

Figure 2A:
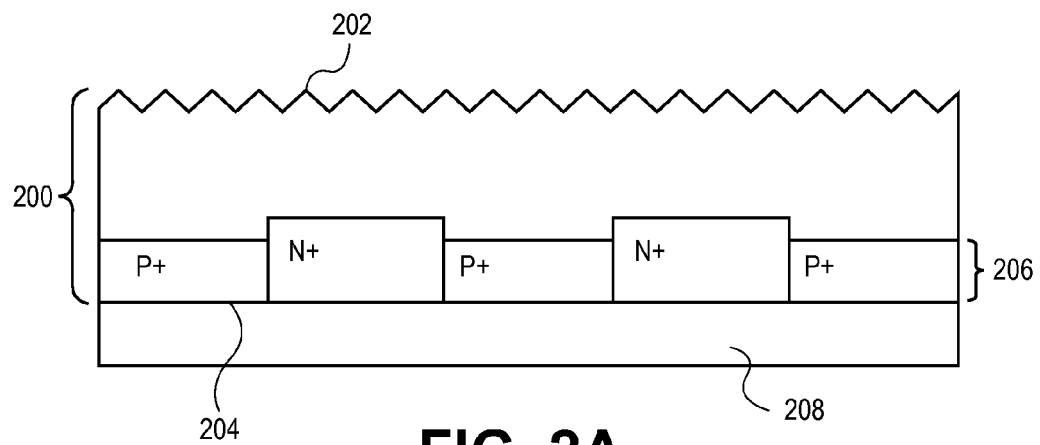
FIG. 2A illustrates a cross-sectional view of a substrate, corresponding to operation 102 from the Flowchart of FIG. 1, in accordance with an embodiment of the present invention.

FIG. 2A illustrates a cross-sectional view of a substrate, corresponding to operation 102 from Flowchart 100, in accordance with an embodiment of the present invention. Referring to operation 102 of Flowchart 100 and corresponding FIG. 2A, a substrate having a light-receiving surface is provided in a process chamber.

Referring to FIG. 2A, a substrate 200 has a light-receiving surface 202 and a back surface 204. In an embodiment, light-receiving surface 202 is textured, as depicted in FIG. 2A, to mitigate undesirable reflection during solar radiation collection efficiency. A plurality of active region 206 is formed at back surface 204 of substrate 200. In accordance with an embodiment of the present invention, the plurality of active regions 206 includes alternating N+ and P+ regions, as depicted in FIG. 2A. In one embodiment, substrate 200 is composed of silicon, the N+ regions include phosphorous dopant impurity atoms and the P+ regions include boron dopant impurity atoms. A dielectric layer 208 is disposed on back surface 204 of substrate 200. In one embodiment, dielectric layer 208 is composed of a material such as, but not limited to, silicon dioxide.

Figure 2B:
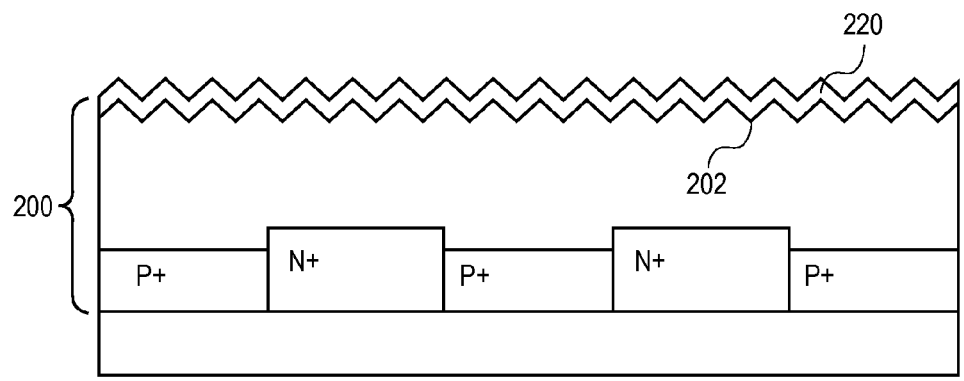
FIG. 2B illustrates a cross-sectional view of a substrate having an anti-reflective coating (ARC) layer formed thereon, corresponding to operation 104 from the Flowchart of FIG. 1, in accordance with an embodiment of the present invention.

FIG. 2B illustrates a cross-sectional view of a substrate having an anti-reflective coating (ARC) layer formed thereon, corresponding to operation 104 from Flowchart 100, in accordance with an embodiment of the present invention. Referring to operation 104 of Flowchart 100 and corresponding FIG. 2B, an ARC layer is formed above light-receiving surface 202 of substrate 200 in the process chamber.

Referring to FIG. 2B, an ARC layer 220 is formed above and conformal with light-receiving surface 202 of substrate 200. In one embodiment, ARC layer 220 is composed of a material such as, but not limited to, silicon nitride, silicon dioxide or titanium oxide. In a specific embodiment, ARC layer 220 is a multi-layer stack including a silicon dioxide portion directly adjacent to light-receiving surface 202 and a silicon nitride portion directly adjacent to the silicon dioxide portion. ARC layer 220 may be formed by any technique suitable to dispose a conformal layer above light-receiving surface 202, as depicted in FIG. 2B. In accordance with an embodiment of the present invention, at least a portion of ARC layer 220 is formed by a technique such as, but not limited to, chemical vapor deposition, plasma-enhanced chemical vapor deposition, atmospheric-pressure chemical vapor deposition or physical vapor deposition. In a specific embodiment, ARC layer 220 is composed of silicon nitride deposited by a plasma-enhanced chemical vapor deposition process and formed to a thickness approximately in the range of 10-100 nanometers.

Figure 2C:
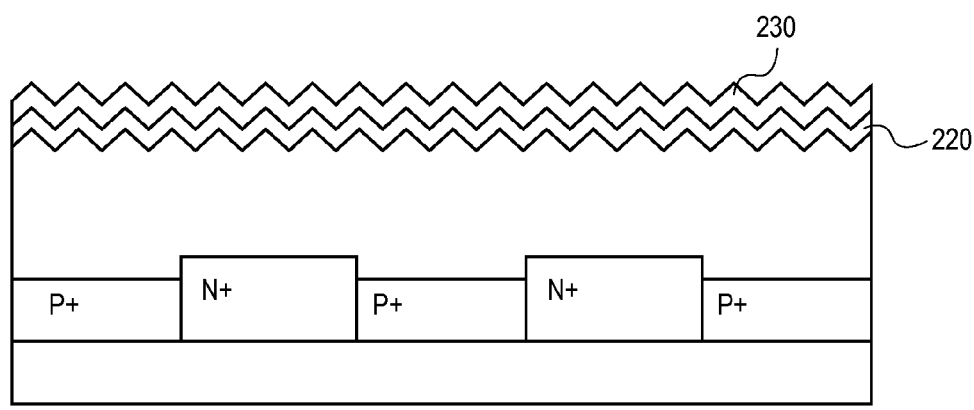
FIG. 2C illustrates a cross-sectional view of a substrate having a protection layer formed thereon, corresponding to operation 106 from the Flowchart of FIG. 1, in accordance with an embodiment of the present invention.

FIG. 2C illustrates a cross-sectional view of a substrate having a protection layer formed thereon, corresponding to operation 106 from Flowchart 100, in accordance with an embodiment of the present invention. Referring to operation 106 of Flowchart 100 and corresponding FIG. 2C, without removing substrate 200 from the process chamber, a protection layer is formed above ARC layer 220.

Referring to FIG. 2C, a protection layer 230 is formed above and conformal with ARC layer 220. Protection layer 230 may be composed of a material and formed by a technique suitable to provide conformal coverage of ARC layer 220. In accordance with an embodiment of the present invention, protection layer 230 is composed of amorphous carbon. In one embodiment, protection layer 230 is formed by vapor deposition using a gas such as, but not limited to, methane ($CH_4$), ethane ($C_2H_6$), propane ($C_3H_8$), ethylene ($C_2H_4$) or propylene ($C_3H_6$). In one embodiment, protection layer 230 is formed by using a liquid hydrocarbon precursor such as, but not limited to, toluene ($C_7H_8$) transported by a carrier gas such as, but not limited to, argon (Ar), nitrogen ($N_2$), helium (He) or hydrogen ($H_2$). In a specific embodiment, protection layer 230 is composed of amorphous carbon and is formed at a temperature of less than approximately 500 degrees Celsius and, more preferably, at a temperature of less than approximately 400 degrees Celsius. In accordance with another embodiment of the present invention, protection layer 230 is composed of amorphous silicon. In one embodiment, protection layer 230 is formed by vapor deposition using a gas such as, but not limited to, silane ($SiH_4$) gas. Protection layer 230 may be formed to a thickness suitable to provide a pin-hole-free coverage of ARC layer 220 while being sufficiently easy to remove at a subsequent processing step. In one embodiment, protection layer 230 is formed to a thickness approximately in the range of 1-30 nanometers. In a specific embodiment, protection layer 230 is resistant to a BOE.

In accordance with an embodiment of the present invention, protection layer 230 is formed directly after the formation of, and in the same process chamber as, ARC layer 220. For example, in an embodiment, ARC layer 220 is first formed in the process chamber and then, without removing substrate 200 from the process chamber, protection layer 230 is formed on ARC layer 220. Thus, in an embodiment of the present invention, at least one complete process step is eliminated from an integration scheme for fabricating a solar cell. In one embodiment, ARC layer 220 and protection layer 230 are formed by the same technique such as, but not limited to, chemical vapor deposition, plasma-enhanced chemical vapor deposition, atmospheric-pressure chemical vapor deposition or physical vapor deposition. In a specific embodiment, ARC layer 220 and protection layer 230 are formed by first flowing, in a process chamber, at least a first process gas and a second process gas to form ARC layer 220 above light-receiving surface 202 of substrate 200. Then, without removing substrate 200 from the process chamber, at least the first process gas, but not the second process gas, is flowed to form protection layer 230 above ARC layer 220. In a particular embodiment, ARC layer 220 is composed of a material such as, but not limited to, silicon nitride, silicon oxy-nitride or carbon-doped silicon oxide, protection layer 230 is composed of amorphous silicon, the first process gas is silane ($SiH_4$) and the second process gas is ammonia ($NH_3$).

Figure 2D:
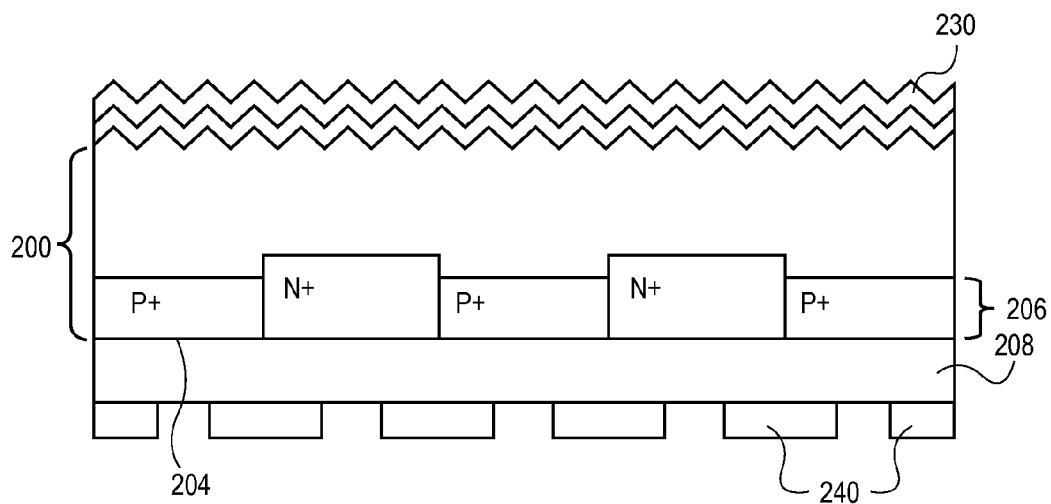
FIG. 2D illustrates a cross-sectional view of a substrate having a masking layer formed thereon, in accordance with an embodiment of the present invention.

Following formation of protection layer 230, dielectric layer 208 may be patterned to form a plurality of contact openings to the plurality of active regions 206 at back surface 204 of substrate 200. FIG. 2D illustrates a cross-sectional view of a substrate having a mask layer formed thereon, in accordance with an embodiment of the present invention. Referring to FIG. 2D, a mask layer 240 is disposed on dielectric layer 208. In an embodiment, the pattern of mask layer 240 determines the location where a plurality of contact openings will subsequently be formed. In one embodiment, mask layer 240 is composed of a material such as, but not limited to, an organic ink or an organic photo-resist.

Figure 2E:
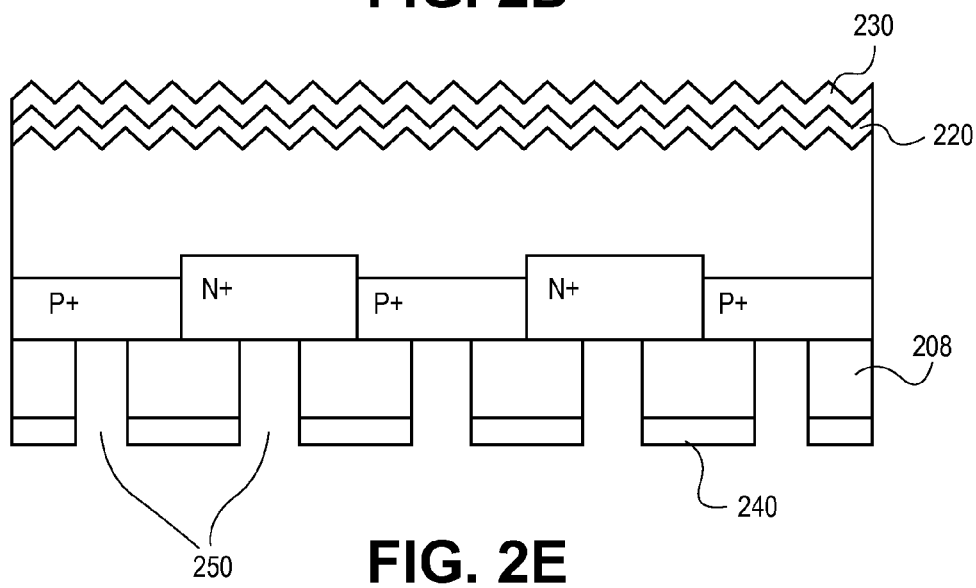
FIG. 2E illustrates a cross-sectional view of a substrate having a plurality of contact openings formed thereon, in accordance with an embodiment of the present invention.

FIG. 2E illustrates a cross-sectional view of a substrate having a plurality of contact openings formed thereon, in accordance with an embodiment of the present invention. Referring to FIG. 2E, a plurality of contact openings 250 is formed in dielectric layer 208 in regions determined by mask layer 240. In accordance with an embodiment of the present invention, the plurality of contact openings 250 is formed by etching dielectric layer 208 using a BOE. In one embodiment, protection layer 230 protects ARC layer 220 during the forming of the plurality of contact openings 250 with the BOE. In a specific embodiment, the BOE is composed of an aqueous solution that includes hydrofluoric acid (HF) and ammonium fluoride ($NH_4F$). In a particular embodiment, the HF:$NH_4F$ ratio is approximately in the range of 1:4-1:10 and the BOE is applied to dielectric layer 208 for a duration approximately in the range of 3-10 minutes at a temperature approximately in the range of 30-40 degrees Celsius.

Figure 2F:
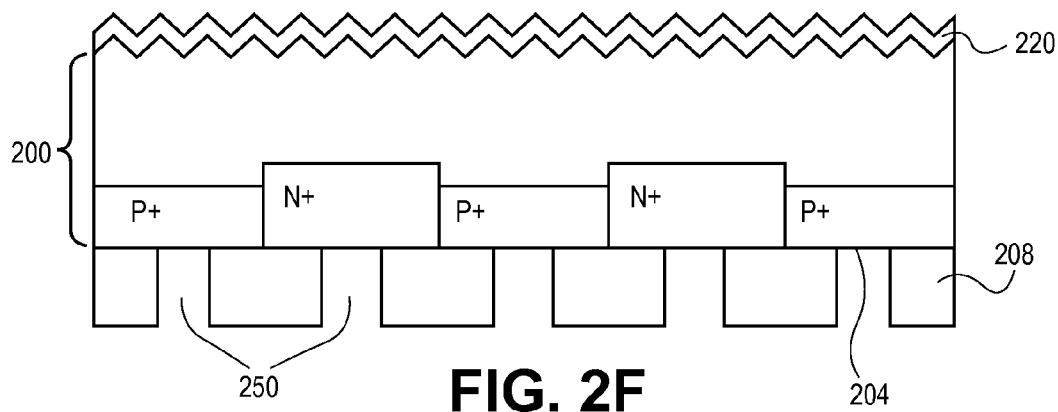
FIG. 2F illustrates a cross-sectional view of a substrate having the protection layer and the masking layer removed, in accordance with an embodiment of the present invention.

FIG. 2F illustrates a cross-sectional view of a substrate having the protection layer and the masking layer removed, in accordance with an embodiment of the present invention. Referring to FIG. 2F, protection layer 230 is removed to re-expose the top surface of ARC layer 220 and mask layer 240 is removed to re-expose the top surface of dielectric layer 208. Thus, in accordance with an embodiment of the present invention, protection layer 230 need only be retained throughout the patterning of dielectric layer 208 to form the plurality of contact openings 250. In one embodiment, protection layer 230 and mask layer 240 are removed in the same process step. For example, in a specific embodiment, protection layer 230 is composed of amorphous carbon and is removed by using a wet etchant that includes sulfuric acid ($H_2SO_4$) and hydrogen peroxide ($H_2O_2$) and is applied for a duration in the range of 10-30 seconds. In another specific embodiment, protection layer 230 is composed of amorphous silicon and is removed by using a wet etchant that includes potassium hydroxide (KOH) and water and is applied for a duration sufficiently long to completely remove the amorphous silicon protection layer, but sufficiently short as to mitigate any detrimental loss of silicon from the exposed portions of back surface 204 of substrate 200. In a particular embodiment, the loss of silicon from the exposed portions of back surface 204 of substrate 200 is targeted to be less than approximately 10 nanometers.

Figure 2G:
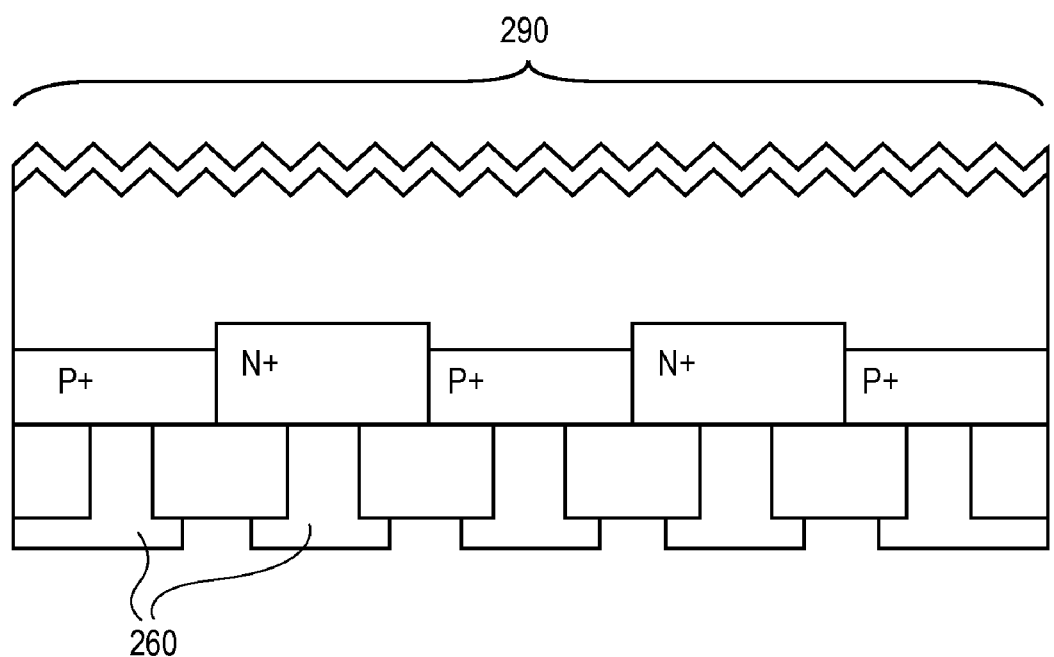
FIG. 2G illustrates a cross-sectional view of a substrate having a plurality of contacts formed in the plurality of contact openings, in accordance with an embodiment of the present invention.

FIG. 2G illustrates a cross-sectional view of a substrate having a plurality of contacts formed in the plurality of contact openings, in accordance with an embodiment of the present invention. Referring to FIG. 2G, a plurality of contacts 260 is formed by depositing a metal-containing material into the plurality of contact openings 250. In one embodiment, the metal-containing material is composed of a metal such as, but not limited to, aluminum, silver, palladium or alloys thereof. In accordance with an embodiment of the present invention, a back side contact solar cell 290 is thus formed. Back side contact solar cells are also disclosed in U.S. Pat. Nos. 5,053,083 and 4,927,770, the entire contents of which are hereby incorporated by reference herein.

Thus, a method for fabricating a solar cell has been disclosed. In accordance with an embodiment of the present invention, a substrate having a light-receiving surface is provided in a process chamber. An ARC layer is then formed, in the process chamber, above the light-receiving surface of the substrate. Finally, without removing the substrate from the process chamber, a protection layer is formed above the ARC layer. In one embodiment, the protection layer comprises amorphous carbon. In another embodiment, the protection layer comprises amorphous silicon.

The advantages of the method for fabricating solar cells of the present invention over previous or conventional cells and methods may include: (i) substantial savings in the cost of fabricating solar cells through the elimination of the need for a dedicated tool to form a protection layer for an ARC layer, (ii) significant reduction in the time needed to fabricate solar cells through the combining of the ARC layer and protection layer deposition steps, and (iii) improved yield through the reduced handling of the substrate achieved through the deposition of the protection layer in the same process chamber used to form an ARC layer.

What is claimed is:

1. A method for fabricating a solar cell, comprising:
   providing, in a process chamber, a substrate having a light-receiving surface;
   forming, in the process chamber, an anti-reflective coating (ARC) layer above the light-receiving surface of the substrate; and, without removing the substrate from the process chamber,
   forming a protection layer above the ARC layer; and, subsequently,
   removing the protection layer to re-expose the ARC layer.

2. The method of claim 1, wherein the protection layer comprises amorphous carbon.

3. The method of claim 2, wherein the protection layer is formed by vapor deposition using a gas selected from the group consisting of methane ($CH_4$), ethane ($C_2H_6$), propane ($C_3H_8$), ethylene ($C_2H_4$), propylene ($C_3H_6$), and liquid toluene ($C_7H_8$) transported by a carrier gas selected from the group consisting of argon (Ar), nitrogen ($N_2$), helium (He) and hydrogen ($H_2$).

4. The method of claim 1, wherein the protection layer comprises amorphous silicon.

5. The method of claim 4, wherein the protection layer is formed by vapor deposition using silane ($SiH_4$) gas.

6. The method of claim 1, wherein the protection layer is formed to a thickness approximately in the range of 1-30 nanometers.

7. The method of claim 1, wherein both the ARC layer and the protection layer are formed by a technique selected from the group consisting of chemical vapor deposition, plasma-enhanced chemical vapor deposition, atmospheric-pressure chemical vapor deposition and physical vapor deposition.

8. The method of claim 1, wherein the protection layer is resistant to a buffered oxide etch (BOE).

9. A method for fabricating a solar cell, comprising:
   providing a substrate having a light-receiving surface and a second surface with a plurality of active regions;
   forming, in a process chamber, an anti-reflective coating (ARC) layer above the light- receiving surface of the substrate; and, without removing the substrate from the process chamber,
   forming a protection layer above the ARC layer;
   forming, using a buffered oxide etch (BOE), a plurality of contact openings to the plurality of active regions at the second surface of the substrate, wherein the protection layer protects the ARC layer during the forming of the plurality of contact openings;
   removing the protection layer; and
   forming a plurality of contacts in the plurality of contact openings.

10. The method of claim 9, wherein the protection layer comprises amorphous carbon.

11. The method of claim 10, wherein the protection layer is formed by vapor deposition using a gas selected from the group consisting of methane ($CH_4$), ethane ($C_2H_6$), propane ($C_3H_8$), ethylene ($C_2H_4$), propylene ($C_3H_6$), and liquid toluene ($C_7H_8$) transported by a carrier gas selected from the group consisting of argon (Ar), nitrogen ($N_2$), helium (He) and hydrogen ($H_2$).

12. The method of claim 9, wherein the protection layer comprises amorphous silicon.

13. The method of claim 12, wherein the protection layer is formed by vapor deposition using silane ($SiH_4$) gas.

14. The method of claim 9, wherein the protection layer is formed to a thickness approximately in the range of 1-30 nanometers.

15. The method of claim 9, wherein both the ARC layer and the protection layer are formed by a technique selected from the group consisting of chemical vapor deposition, plasma-enhanced chemical vapor deposition, atmospheric-pressure chemical vapor deposition and physical vapor deposition.

16. A method for fabricating a solar cell, comprising:
   providing, in a process chamber, a substrate having a light-receiving surface;
   flowing, in the process chamber, at least a first process gas and a second process gas to form an anti-reflective coating (ARC) layer above the light-receiving surface of the substrate; and, without removing the substrate from the process chamber, flowing, in the process chamber, at least the first process gas, but not the second process gas, to form a protection layer above the ARC layer; and, subsequently, removing the protection layer to re-expose the ARC layer.

17. The method of claim 16, wherein the protection layer comprises amorphous silicon, and wherein the ARC layer comprises a material selected from the group consisting of silicon nitride, silicon oxy-nitride and carbon-doped silicon oxide.

18. The method of claim 17, wherein the first process gas is silane ($SiH_4$) and the second process gas is ammonia ($NH_3$).

19. The method of claim 16, wherein the protection layer is formed to a thickness approximately in the range of 1-30 nanometers.

20. The method of claim 16, wherein both the ARC layer and the protection layer are formed by a technique selected from the group consisting of chemical vapor deposition, plasma-enhanced chemical vapor deposition, atmospheric-pressure chemical vapor deposition and physical vapor deposition.

* * * * *

UNITED STATES PATENT AND TRADEMARK OFFICE
CERTIFICATE OF CORRECTION

PATENT NO.        : 7,670,638 B2
APPLICATION NO.   : 12/106561
DATED             : March 2, 2010
INVENTOR(S)       : Hsin-Chiao Luan and Peter Cousins It is certified that error appears in the above-identified patent and that said Letters Patent is hereby corrected as shown below:

Column 1, lines 11-13 between the paragraph entitled "Cross Reference to Related Applications" and the paragraph entitled "Technical Field" please insert the statement regarding federally sponsored research or development -- This invention was made with Government support under DE-FC36-07GO17043 awarded by the United States Department of Energy. The Government has certain rights in this invention. --

Signed and Sealed this

Thirteenth Day of September, 2011

David J. Kappos
*Director of the United States Patent and Trademark Office*